(12) United States Patent
Yoshida

(10) Patent No.: US 6,181,613 B1
(45) Date of Patent: Jan. 30, 2001

(54) SEMICONDUCTOR MEMORY DEVICE OPERABLE IN BURST MODE AND NORMAL MODE THROUGH IMPROVED SWITCHING OPERATIONS

(75) Inventor: Souichirou Yoshida, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/342,666

(22) Filed: Jun. 29, 1999

(30) Foreign Application Priority Data

Jun. 29, 1998 (JP) .................................................. 10-182191

(51) Int. Cl.$^7$ ....................................................... G11C 7/00
(52) U.S. Cl. .............................................. 365/191; 365/222
(58) Field of Search ..................................... 365/191, 222

(56) References Cited

U.S. PATENT DOCUMENTS 4,977,537 * 12/1990 Dias et al. ............................ 365/222

* cited by examiner

Primary Examiner—David Nelms
Assistant Examiner—M. Tran

(57) ABSTRACT

The present invention provides a semiconductor memory device operable both in a burst mode and in a normal mode, wherein the semiconductor memory device utilizes at least a single normal mode commend both for its original purpose in the normal mode and also for generating, in the burst mode, a burst stop commend to stop a burst mode operation of the semiconductor memory device.

3 Claims, 2 Drawing Sheets

SEMICONDUCTOR MEMORY DEVICE OPERABLE IN BURST MODE AND NORMAL MODE THROUGH IMPROVED SWITCHING OPERATIONS

BACKGROUND OF THE INVENTION

The present invention relates to a semiconductor memory device, and more particularly to a switching between burst mode and normal mode of the semiconductor memory device.

The majority of the advanced dynamic random access memory is a synchronous dynamic random access memory (SDRAM) which is operable in high speed clock such as 100 MHz. This SDRAM may be fabricated in almost the same cost as the conventional DRAM. The SDARM is operated in burst mode which allows sequential or continuous accesses to memory cells in the same page upon once input of the address. For example, in the burst mode, one of plural modes is selected, so as to allow continuous and sequential accesses to 1, 2, 4 and 8 bits data or all bits data on one page.

In order to discontinue the operation in the burst mode of the SDRAM, it is necessary to enter a burst stop command or a pre-charge command.

In order to realize a highly efficient data transmission between the SDRAM and the CPU or controller, it is highly required to reduce the number of the commands or instructions. Particularly, the burst stop command may be substituted by the pre-charge command. The CPU or controller may be free of the burst stop command. Namely, in the SDRAM, two systems co-exist wherein the first type system has the burst stop command whilst the second type system is free from the burst stop command and the second system.

If the burst stop command is eliminated from the system using the SDRAM, only the pre-charge command is the sole commend to stop the operation of the SDRAM in the burst mode. No particular problem is raised in the system using the normal SDRAM.

By the way, the present inventor had proposed a virtual channel synchronous dynamic random access memory (VCSDRAM) or increase the access speed. The virtual channel memory a memory cell array of plural DRAM memory cells aligned in matrix, and a resistor array having row and column numbers in correspondence with the row and column numbers of the memory cell array and having a cache function. The resistor array comprises SRAM.

The above virtual channel memory combines SRAM and DRAM is incapable of ending the read and write operations in the burst mode as a foreground operation from the resistor array with the pre-charge command as the background operation.

In the system free of the burst stop command, it is difficult to discontinue the operation in the burst mode of the virtual channel memory for change to the normal operation mode.

In the above circumstances, it had been required to develop a novel semiconductor memory device free from the above problem.

SUMMARY OF THE INVENTION

Accordingly, it is an object of the present invention to provide a novel semiconductor memory device free from the above problems.

It is a further object of the present invention to provide a novel semiconductor memory device being operable in both burst mode and normal mode and being capable of discontinuing operation in the burst mode without increase in the number of commands of system even if the semiconductor memory device is provided in the system free of burst stop command.

The present invention provides a semiconductor memory device operable both in a burst mode and in a normal mode, wherein the semiconductor memory device utilizes at least a single normal mode command both for its original purpose in the normal mode and also for generating, in the burst mode, a burst stop command to stop a burst mode operation of the semiconductor memory device.

The above and other objects, features and advantages of the present invention will be apparent from the following descriptions

BRIEF DESCRIPTION OF THE DRAWINGS

Preferred embodiments according to the present invention will be described in detail with reference to the accompanying drawings.

DISCLOSURE OF THE INVENTION

The present invention provides a semiconductor memory device operable both in a burst mode and in a normal mode, wherein the semiconductor memory device utilizes at least a single normal mode command both for its original purpose in the normal mode and also for generating, in the burst mode, a burst stop command to stop a burst mode operation of the semiconductor memory device.

It is preferable that the semiconductor memory device comprises: a first circuitry for generating a burst stop signal in accordance with the at least single normal mode command; and a second circuitry for generating, in the normal mode, a predetermined signal in accordance with the at least single normal mode command and also for disabling, in the burst mode, the at least single normal mode command.

It is also preferable that the at least single normal mode command comprises at least one of a mode resistor set command for setting modes of the semiconductor memory device, a self-refresh signal and a write command.

It is also preferable that the semiconductor memory device is a virtual channel memory.

In accordance with the present invention, the semiconductor memory device operable in a burst mode and a normal mode, wherein the semiconductor memory device utilizes one command used in the normal mode to discontinue operation in the burst mode.

Any signals without limiting any specific command may be available for the one command used for discontinuation of operation in the burst mode, for example, a mode resistor set command, a self-refresh command or a write commend may be available, which is, however, inhibited in use in the burst mode. For example, the mode resistor set signal is a signal which becomes high level "H" or low level "L" in accordance with the results of selecting one of the burst mode and the normal mode for control to the resistor.

In order to utilize the one command for generation of the burst stop signal in the burst mode and further in order to utilize the one command in the normal mode for the original purpose, it is preferable to provide a burst stop signal generating circuit for generating a burst stop signal from the above one command and further provide, in the circuit generating a corresponding signal by utilizing the one command in the normal mode, a device for disabling a signal in the burst mode, even this signal is the enable signal in the normal mode.

The above present invention is applicable to the virtual channel memory so that the virtual channel memory is capable of switching between the burst mode and the normal mode without increase in the number of the commands of the system.

PREFERRED EMBODIMENTS

First Embodiment

Figure 1:
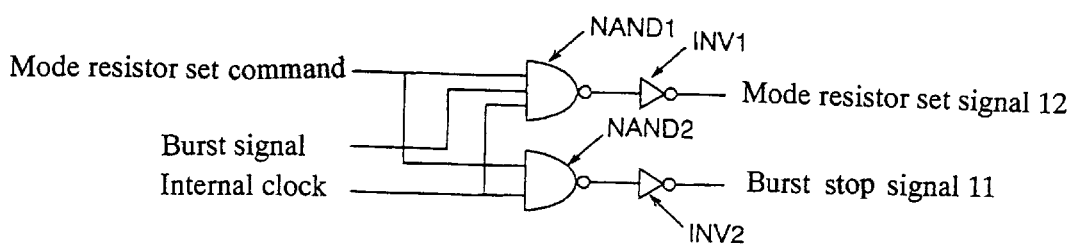
FIG. 1 is a block diagram illustrative of a logic circuit in a novel semiconductor memory device in the first embodiment in accordance with the present invention.

A first embodiment according to the present invention will be described in detail with reference to the drawings. FIG. 1 is a block diagram illustrative of a logic circuit in a novel semiconductor memory device in the first embodiment in accordance with the present invention. The logic circuit in the novel semiconductor memory comprises a first logic circuitry 11 and a second logic circuitry 12. The first logic circuitry 11 generates a burst stop signal by utilizing a mode resistor set command during operations in the burst mode. The second logic circuitry 12 generates a mode resistor set signal from the mode resistor set command in other operational mode than the burst mode and also enabling the mode resistor set command in the burst mode.

The first logic circuitry 11 comprises a second NAND gate "NAND 2" and a second invertor "INV2" connected to an output side of the second NAND gate "NAND 2". The second NAND gate "NAND 2" has two inputs which receive the mode resistor set command and an internal clock respectively. The second invertor "INV2" receives an output signal from the second NAND gate "NAND 2", thereby outputting a burst stop signal. The first logic circuitry 11 is thus capable of generating the burst stop signal on the bases of the mode resistor set command.

The second logic circuitry 12 comprises a first NAND gate "NAND 1" and a first invertor "INV1" connected to an output side of the first NAND gate "NAND 1". The first NAND gate "NAND 1" has three inputs which receive the mode resistor set command, a burst signal which becomes high level other mode than the burst mode, and an internal clock respectively. The first invertor "INV1" receives an output signal from the first NAND gate "NAND 1", thereby outputting a mode resistor set signal. The first logic circuitry 11 is thus capable of generating the burst stop signal on the bases of the mode resistor set command.

The mode resistor set command is not generated in the burst mode operation. The mode resistor set command is thus an inhibition commend. The mode resistor set command is used for generating the burst stop signal which ends the burst mode operation.

When, in the other operational mode than the burst mode operation, the burst signal is in the high level, and the mode resistor set command is inputted in synchronizing with the clock signal, then the second logic circuitry 12 causes the mode resistor set signal to be high level or to be enabled. Namely, except in the burst mode operation, the mode resistor set command is used as its original command for setting the mode resistor. The first logic circuit 11 causes the burst stop signal to be high level in the other operational mode than the burst mode, for which reason the burst stop signal generated in the other operational mode than the burst mode is not effective.

In the burst mode operation, the mode set resistor command is generated. In the second logic circuitry 12, the first NAND gate "NAND1" is disabled by the burst signal. No mode resistor set signal is generated. On the other hand, in the first logic circuitry 11, the burst stop signal is enabled in synchronizing with the internal clock signal whereby the burst mode operation is ended, thereby allowing generation of the burst mode stop signal in accordance with the mode resistor set command during the burst mode operation. In the normal mode other than the burst mode, the mode resistor set command is used for its original purpose.

In the system free of the burst mode stop command, it is possible to discontinue the burst mode operation of the virtual channel memory.

Second Embodiment

Figure 2:
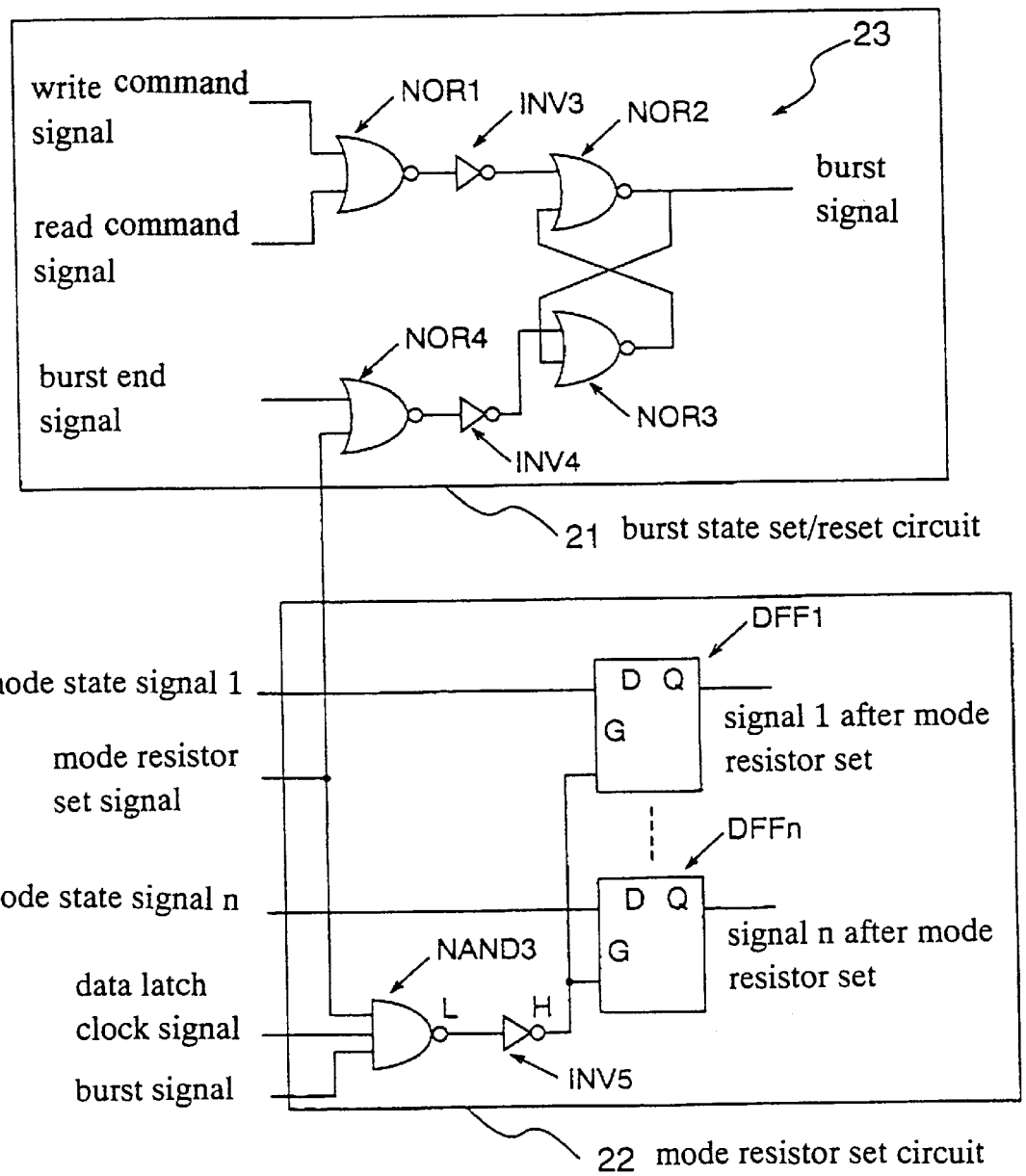
FIG. 2 is a block diagram illustrative of a logic circuit in a second novel semiconductor device in the second embodiment in accordance with the present invention.

A second embodiment according to the present invention will be described in detail with reference to the drawing. FIG. 2 is a block diagram illustrative of a logic circuit in a second novel semiconductor device in the second embodiment in accordance with the present invention. The second novel semiconductor memory device has a burst state set/reset circuit 21 and a mode resistor set circuit 22.

The burst state set/reset circuit 21 has the following logic gates. A first NOR gate "NOR1" has two inputs receiving a write command signal and a read command signal. A first invertor "INV3" is connected to an output side of the first NOR gate "NOR1" for receiving an output from the first NOR gate "NOR1". A fourth NOR gate "NOR4" has two inputs receiving a burst end signal as a burst end command after the burst operation of a predetermined bit number has been ended and a mode resistor set signal which compulsorily ends the burst mode operation. A second invertor "INV4" is connected to an output side of the fourth NOR gate "NOR4" for receiving an output from the fourth NOR gate "NOR4". A latch circuit 23 is connected to the first and second invertors "INV3" and "INV4". The latch circuit 23 comprises a second NOR gate "NOR2" and a third NOR gate "NOR3", wherein the second NOR gate "NOR2" has two inputs receiving an output from the first invertor "INV3" and an output from the third NOR gate "NOR3", whilst the third NOR gate "NOR3" has two inputs receiving an output from the second invertor "INV4" and an output from the second NOR gate "NOR2". The output from the second NOR gate "NOR2" is fetched to be the burst signal as the output of the latch circuit 23. If any one of the write command signal and the read command signal is generated, the output as the burst signal form the latch circuit 23 becomes low level "L", whereby the burst signal is activated for entry into the burst mode. If any one of the burst end signal and the mode resistor set command is generated, the output as the burst signal form the latch circuit 23 becomes high level "H".

The mode resistor set circuit 22 has a first NAND gate "NAND3", a first invertor "INV5", the same number of flip-flop circuits "DFF1 - - - DFFn" as the mode number "n". The first NAND gate "NAND3" has three inputs receiving the burst signal which becomes low level in the burst mode, a data latch clock signal and a mode resistor set signal. The first invertor "INV5" is connected to an output side of the first NAND gate "NAND3" for receipt of the output from the first NAND gate "NAND3". The set of the flip-flop circuits "DFF1 - - - DFFn" latch mode selective signals 1–n representing individual modes in response to output from the first invertor "INV5".

Outputs from the individual flip-flop circuits "DFF1 - - - DFFn" serve as mode signals. If the output from the burst state set/reset circuit 21 is low level "L" when output from any of the individual flip-flop circuits "DFF1 - - - DFFn" is in the low level, then the semiconductor memory device is operated in the burst mode.

If the mode resistor set signal is made into high level under the burst signal being the high level or under the normal operational mode other than the burst mode, then the output from the first NAND gate "NAND3" becomes low level in response to the high level of the data latch clock signal. This signal is transmitted through the first invertor "INV5" to the individual flip-flop circuits "DFF1 - - - DFFn" thereby latching the individually corresponding mode selective signals, whereby the memory enters into the specific mode designated by the mode selective signals "1–n" representing the mode states, namely, the mode resistor set signal is used for its original purpose.

If the mode resistor set signal is made high level during the burst signal being low level or in the burst mode, then no change appears on the output from the first NAND gate "NAND3" disabled by the burst signal, whereby no change appears on the mode resistor set circuit 22. On the other hand, the output from the burst state set/reset circuit 21 is changed from the low level to the high level whereby the memory becomes out of the burst mode, thereby utilizing the mode resistor set signal as the burst mode stop signal.

The above novel semiconductor memory device in accordance with the present invention is capable of utilizing the one normal mode command for the original propose in the normal mode other than the burst mode and also utilizing the one normal mode command as a command for generating the burst stop command in the burst mode.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device operable both in a burst mode and in a normal mode, wherein the semiconductor memory device utilizes at least a single normal mode command both for its original purpose in the normal mode and also for generating, in the burst mode, a burst stop command to stop a burst mode operation of the semiconductor memory device, a first circuitry for generating a burst stop signal in accordance with the at least single normal mode command; and a second circuitry for generating, in the normal mode, a predetermined signal in accordance with the at least single normal mode command and also for disabling, in the burst mode, the at least single normal mode command.

2. The semiconductor memory device as claimed in claim 1, wherein the at least single normal mode command comprises at least one of a mode resistor set command for setting modes of the semiconductor memory device, a self-refresh signal and a write command.

3. The semiconductor memory device as claimed in claim 1, wherein the semiconductor memory device is a virtual channel memory.

* * * * *